United States Patent [19]

Sano

[11] 4,307,308

[45] Dec. 22, 1981

[54] DIGITAL SIGNAL CONVERSION CIRCUIT

[75] Inventor: Jun-ichi Sano, Chelmsford, Mass.

[73] Assignee: GTE Laboratories Incorporated, Waltham, Mass.

[21] Appl. No.: 95,765

[22] Filed: Nov. 19, 1979

[51] Int. Cl.³ ............................................. H03L 5/00
[52] U.S. Cl. ................................. 307/475; 307/264; 307/499; 307/501
[58] Field of Search ............... 307/475, 264, 279, 251, 307/499, 501

[56] References Cited

U.S. PATENT DOCUMENTS

| | | | |
|---|---|---|---|
| 3,612,908 | 10/1971 | Heimbigner | 307/251 |
| 3,916,430 | 10/1975 | Heuner et al. | 357/42 |
| 4,000,411 | 12/1976 | Sano et al. | 307/475 |
| 4,023,050 | 5/1977 | Fox et al. | 307/279 |
| 4,032,795 | 6/1977 | Hale | 307/264 |
| 4,035,662 | 7/1977 | Kuo | 307/279 |
| 4,039,860 | 8/1977 | Lambrechtse et al. | 307/279 |
| 4,074,148 | 2/1978 | Sato | 307/279 |
| 4,096,402 | 6/1978 | Schroeder et al. | 307/264 |
| 4,110,633 | 8/1978 | Blaser et al. | 307/475 |
| 4,128,775 | 12/1978 | Frederiksen et al. | 307/264 |
| 4,181,865 | 1/1980 | Kohyama | 307/279 |
| 4,256,974 | 3/1981 | Padgett et al. | 307/475 |
| 4,264,829 | 4/1981 | Misaizu | 307/475 |

*Primary Examiner*—Saxfield Chatmon, Jr.
*Attorney, Agent, or Firm*—David M. Keay

[57] ABSTRACT

Circuit for converting input signals at TTL voltage levels to output signals at voltage levels for use with MOS logic circuits. The circuit employs an arrangement of NMOS FET's. Six FET's are arranged in pairs to form three inverters. Another FET is connected in series between the input terminal and different portions of the first and second of the three inverters. The output of the second inverter is fed back to the gate electrode of one of the FET's of the first inverter and to the gate electrode of the series connected FET. The output of the second inverter is also applied to the third inverter. The excursion between voltage levels representing logic 1 and logic 0 at the output of the third inverter is greater than the excursion between voltage levels representing logic 1 and logic 0 at the input to the circuit.

13 Claims, 2 Drawing Figures

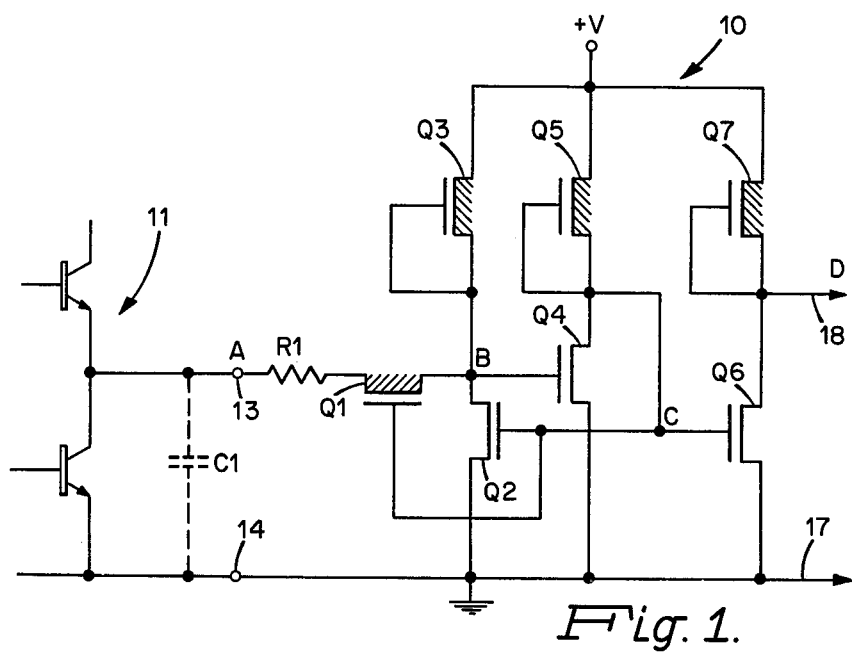
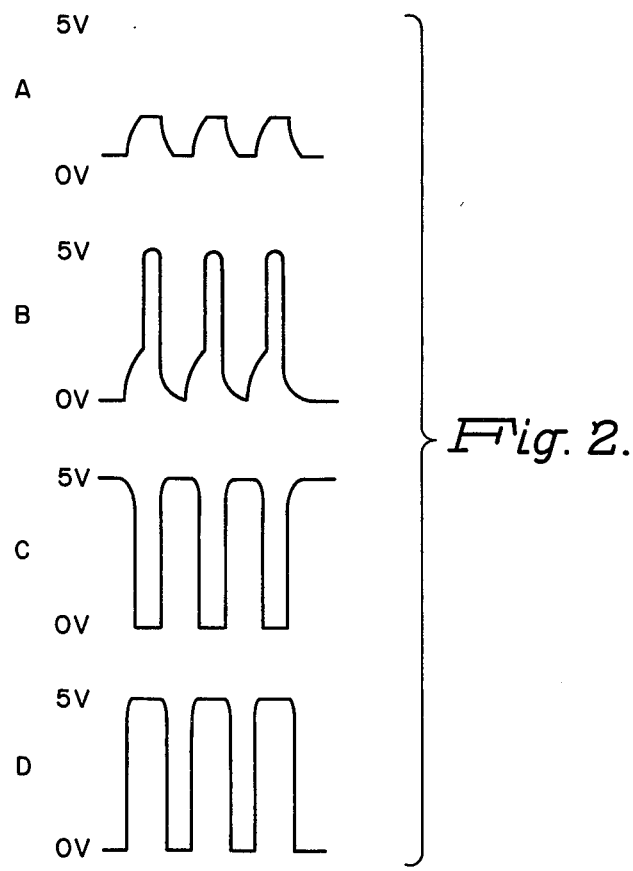
Fig. 1.
Fig. 2.

DIGITAL SIGNAL CONVERSION CIRCUIT

BACKGROUND OF THE INVENTION

This invention relates to circuits for converting the voltage levels of binary digital logic signals. More particularly, it is concerned with circuitry for converting from voltage levels for transistor-transistor-logic (TTL) to voltage levels compatible with metal-oxide-silicon (MOS) logic.

One widely used well-known family of logic integrated circuits employing bipolar transistors is known as transistor-transistor-logic (TTL). For circuits of this family it is specified that an output voltage of 0.4 volts maximum defines a logic 0 and an output voltage of 2.4 volts minimum defines a logic 1. In order to provide tolerances for inadvertent variations including noise, the maximum input voltage for a logic 0 is 0.8 volts and the minimum input voltage for a logic 1 is 2.0 volts. Another widely used family of logic circuits is known as metal-oxide-silicon (MOS) logic. The circuits of this logic family employ a much wider voltage excursion to represent logic 0 and logic 1. For example, with a 5 volt operating voltage logic 0 is very close to ground and logic 1 is very close to the 5 volt operating potential.

Frequently it is desirable to apply signals at TTL logic levels to MOS logic circuits for further processing. Although MOS logic gates operating with a 5 volt operating potential can be fabricated to provide a tripping point between 0.8 volts and 2.0 volts, the logic 1 level of 2.0 volts is not sufficiently high to drive MOS gates effectively and the logic 0 voltage of 0.8 volts is not sufficiently low to prevent MOS gates from false triggering in the presence of noise. Thus, conversion or interface circuitry is required to convert the TTL logic voltages to appropriate voltage levels for MOS logic circuits. Various conversion circuits have been designed to provide this function and these circuits are satisfactory for many applications. For many situations, however, it is desirable that the conversion circuit be extremely simple employing a minimun number of components and be amenable to fabrication with MOS integrated circuitry. It is also desirable that the circuit operate at high speed, have high immunity to noise, and provide isolation between the stray capacitance due to wiring and the MOS circuitry.

SUMMARY OF THE INVENTION

An improved digital signal conversion circuit in accordance with the present invention includes an input terminal for receiving input signals having a first voltage condition or a second voltage condition. A first field effect transistor is connected in series between the input terminal and a first connection point and a second field effect transistor is connected between the first connection point and a point of reference potential. A third field effect transistor is connected between a source of operating potential and the first connection point and a fourth field effect transistor is connected between a second connection point and the point of reference potential. A fifth field effect transistor is connected between the source of operating potential and the second connection point. The first connection point is connected to the gate of the fourth field effect transistor, and the second connection point is connected to the gate of the first field effect transistor and to the gate of the second field effect transistor.

The first field effect transistor operates in response to a first voltage condition at the input terminal to produce a voltage at the first connection point which biases the fourth field effect transistor to a high impedance condition thereby producing a third voltage condition at the second connection point. The first field effect transistor operates in response to a second voltage condition at the input terminal to produce a voltage at the first connection point which biases the fourth field effect transistor to a low impedance condition thereby producing a fourth voltage condition at the second connection point. The first and second field effect transistors are both biased to conduction in response to the third voltage condition being present at the second connection point and are biased to nonconduction in response to the fourth voltage condition being present at the second connection point.

BRIEF DESCRIPTION OF THE DRAWINGS

In the drawings:

FIG. 1 is a schematic circuit diagram of a digital signal conversion circuit in accordance with the present invention; and FIG. 2 illustrates waveforms of voltages at various points in the circuit of FIG. 1 under operating conditions.

For a better understanding of the present invention, together with other and further objects, advantages, and capabilities thereof, reference is made to the following disclosure and appended claims in connection with the above described drawings.

DETAILED DESCRIPTION OF THE INVENTION

An interface circuit 10 for converting signals at TTL logic levels to signals at MOS logic levels is illustrated in FIG. 1. The MOS logic circuitry is of the N-channel MOS, or NMOS, type. The circuit is shown as driven by a TTL logic circuit, the output portion of which is indicated by reference numeral 11. The output of the TTL logic circuit is applied to input terminals 13 and 14 of the conversion circuit 10. Capacitance C1 represents the stray capacitance in the circuit board wiring.

Input terminal 14 is connected to ground. Input terminal 13 (labeled point A) is connected through a resistance R1 of the input protection circuit to one of the conduction path electrodes (the source or drain) of a depletion type field effect transistor (FET) Q1. The other conduction path electrode of FET Q1 is connected to one of the conduction path electrodes of an enhancement type FET Q2. The other conduction path electrode of FET Q2 is connected to ground. The juncture between FET's Q1 and Q2 (labeled point B) is connected to the gate or control electrode and also to one of the conduction path electrodes of a depletion type FET Q3. The other conduction path electrode of FET Q3 is connected to a positive voltage source +V. Point B is also connected to the gate electrode of an enhancement type FET Q4. One of the conduction path electrodes of FET Q4 is connected to ground. The other conduction path electrode of FET Q4 is connected to the gate electrodes of FET's Q1 and Q2 (labeled point C). Point C is also connected to the gate electrode and to one of the conduction path electrodes of a depletion type FET Q5. The other conduction path electrode of FET Q5 is connected to the positive voltage source +V.

Point C is also connected to the gate electrode of an enhancement type FET Q6. The conduction path electrodes of FET Q6 are connected to an output connection 17 at ground and to an output connection 18 (labeled point D). Point D is also connected to the gate electrode and to one of the conduction path electrodes of a depletion type FET Q7. The other conduction path electrode of FET Q7 is connected to the positive voltage source +V. The output connections 17 and 18 are connected to an NMOS logic gate which may be fabricated within the same integrated circuit chip as the conversion circuit 10.

In one specific embodiment in accordance with the present invention, the conversion circuit is adapted to operate in response to TTL logic signals in which the maximum voltage representing a logic 0 is 0.8 volts and the minimum voltage representing a logic 1 is 2.0 volts. All the FET's are N-channel devices. The dimensions of the channels of the FET's are as follows: Q1, 3.0 mils wide by 0.3 mil long; Q2, 0.6 mil wide by 0.3 mil long; Q3, 0.5 mil wide by 0.5 mil long; Q4, 4.0 mils wide by 0.3 mil long; Q5, 0.5 mil wide by 0.5 mil long; Q6, 2.0 mils wide by 0.3 mil long; and Q7, 0.6 mil wide by 0.3 mil long. The positive voltage source +V is 5 volts. The value of the input protection resistance R1 is 400 ohms. The stray capacitance C1 of the circuit board typically is 15–50 picofarads. This embodiment operates satisfactorily with squarewave input signals at 5 MHz.

The conversion circuit 10 as described operates in the following manner in response to output signals from a TTL logic circuit 11. The waveforms of FIG. 2 illustrate the voltages occurring at points A, B, C, and D in the circuit during its operation. When the voltage at the input terminal 13 (point A) is 0.8 volts or less, FET Q1 conducts, thus producing the same voltage at point B. Since the voltage at the gate electrode of FET Q4 is below the tripping voltage of the inverter formed by FET's Q4 and Q5, FET Q4 is in a high impedance condition. The voltage at point C approaches that of the voltage source +V biasing FET's Q1 and Q2 to conduction. Current flow in FET Q2 causes point B to approach ground potential. FET Q2 also bypasses to ground part of the current from point B which would otherwise flow through the input terminal 13 as input load current. FET's Q6 and Q7 form an inverter and with the high volage at point C FET Q6 is in a low impedance condition. The resulting output at the output connection 18 (point D) is a low voltage approaching ground. Since inverter Q6–Q7 inverts the signal at point C, it provides output signals at connection 18 which are consistent in relative polarity with the input signals at terminal 13. Inverter Q6–Q7 also acts as a buffer isolating the elements of the conversion circuit from the MOS gate connected to connections 17 and 18.

When the output of the TTL logic circuit 11 increases to 2.0 volts, or greater, representing a logic 1, the voltage at point B follows that at the input terminal 13 (point A). Since this voltage is greater than the tripping point voltage of inverter Q4–Q5, FET Q4 presents a low impedance. The voltage at point C changes from approximately the supply voltage +V toward ground. This voltage is applied to the gate electrodes of FET's Q1 and Q2. Since the threshold voltage of a depletion type NMOS FET typically is −2.5 volts and the body effect constant is 0.4 volts$^{\frac{1}{2}}$, the voltage of 2.0 volts or greater at point B is sufficient to cause FET Q1 to turn off thus isolating point B from the high input stray capacitance C1. At the same time FET Q2 is also turned off and the voltage at point B rises rapidly to approximately the supply voltage +V. By virtue of the isolation provided by FET Q1 and the pull-up action of FET Q3 together with the positive feedback between points B and C the switching action described takes place very rapidly. The drop in voltage at point C causes the inverter Q6–Q7 to reverse its operating state producing a high output voltage, close to that of the positive voltage source +V, at the output connection 18 (point D).

When the output of the TTL logic circuit 11 returns to logic 0 falling below the 0.8 volt level, FET Q1 starts conducting. Because of the low output impedance of the TTL logic circuit, the voltage at point B rapidly drops below the tripping point of inverter Q4–Q5 changing FET Q4 to the high impedance condition. The voltage at point C increases toward the supply voltage +V causing FET's Q1 and Q2 to become conducting. The action proceeds rapidly due to positive feedback between points B and C, thus reducing the voltage at point B to near ground. Because the voltage at point B is very close to ground, the circut is highly immune to input noise. The high voltage at point C causes the output buffer inverter Q6–Q7 to reverse operating state reducing the voltage level at the output connection 18 (point D) to approximately ground.

The conversion circuit in accordance with the invention as described herein is relatively simple employing only seven MOS FET's together with a single resistance of the input protection circuit. The circuit has high immunity to noise, and provides good isolation between the stray capacitance due to wiring and the MOS signal conversation circuit when the input changes from logic 0 to logic 1. Thus an improved circuit for converting from TTL voltage levels to voltage levels for MOS logic is provided.

While there has been shown and described what is considered a preferred embodiment of the present invention, it will be obvious to those skilled in the art that various changes and modifications may be made therein without departing from the invention as defined by the appended claims.

What is claimed is:

1. A digital signal conversion circuit comprising
an input terminal for receiving input signals having a first voltage condition or a second voltage condition;
a first field effect transistor connected in series between the input terminal and a first connection point;
a second field effect transistor connected between the first connection point and a point of reference potential;
a third field effect transistor connected between a source of operating potential and the first connection point;
a fourth field effect transistor connected between a second connection point and the point of reference potential; and
a fifth field effect transistor connected between the source of operating potential and the second connection point;
the first connection point being connected to the gate of the fourth field effect transistor;
the second connection point being connected to the gate of the first field effect transistor and to the gate of the second field effect transistor;
said first field effect transistor being operable in response to a first voltage condition at the input terminal to produce a voltage at the first connection point biasing the fourth field effect transistor to a high impedance condition thereby producing a third voltage condition at the second connection point;

said first field effect transistor being operable in response to a second voltage condition at the input terminal to produce a voltage at the first connection point biasing the fourth field effect transistor to a low impedance condition thereby producing a fourth voltage condition at the second connection point; and said first and second field effect transistors being biased to conduction in response to said third voltage condition at the second connection point and being biased to nonconduction in response to said fourth voltage condition at the second connection point.

2. A digital signal conversion circuit in accordance with claim 1 wherein
said first field effect transistor is of the depletion type.

3. A digital signal conversion circuit in accordance with claim 2 wherein
said second and fourth field effect transistors are of the enhancement type.

4. A digital signal conversion circuit in accordance with claim 1 including
inverting means having an input connection connected to said second connection point and having an output connection, said inverting means being operable to produce a fifth voltage condition at the output connection when a third voltage condition is present at the second connection point and to produce a sixth voltage condition at the output connection when a fourth voltage condition is present at the second connection point.

5. A digital signal conversion circuit in accordance with claim 4 wherein said inverting means includes
a sixth field effect transistor connected between the output connection and the point of reference potential and having its gate connected to the second connection point; and
a seventh field effect transistor connected between the source of operating potential and the output connection;
said sixth field effect transistor being biased to a low impedance condition in response to the presence of said third voltage condition at the second connection point thereby producing the fifth voltage condition at the output connection and being biased to a high impedance condition in response to the presence of said fourth voltage condition at the second connection point thereby producing the sixth voltage condition at the output connection.

6. A digital signal conversion circuit in accordance with claim 5 wherein
said first field effect transistor is of the depletion type; and
said second, fourth, and sixth field effect transistors are of the enhancement type.

7. A digital signal conversion circuit in accordance with claim 4 wherein
said first field effect transistor is operable in response to a voltage level at the input terminal less than a first predetermined voltage to produce a voltage at the first connection point biasing the fourth field effect transistor to a high impedance condition, and is operable in response to a voltage level at the input terminal greater than a second predetermined voltage to produce a voltage at the first connection point biasing the fourth field effect transistor to a low impedance condition; and said inverting means is operable to produce an output voltage at one predetermined voltage level at its output connection when a third voltage condition is present at the second connection point and to produce an output voltage at another predetermined voltage level at its output connection when a fourth voltage condition is present at the second connection point;

the voltage excursion between said one predetermined voltage level and said other predetermined voltage level at the output connection of the inverting means being greater than the voltage excursion between said first predetermined voltage and said second predetermined voltage at the input terminal.

8. A digital signal conversion circuit comprising
an input terminal for receiving input signals having a first voltage condition or a second voltage condition;
a first field effect transistor of the depletion type connected in series between the input terminal and a first connection point;
a second field effect transistor of the enhancement type connected between the first connection point and a point of reference potential;
a third field effect transistor of the depletion type connected between a source of operating potential and the first connection point;
a fourth field effect transistor of the enhancement type connected between a second connection point and the point of reference potential;
a fifth field effect transistor of the depletion type connected between the source of operating potential and the second connection point;
the gates of the third and fourth field effect transistors being connected to the first connection point;
the gates of the first, second, and fifth field effect transistors being connected to the second connection point.

whereby when a first voltage condition is present at the input terminal a third voltage condition is produced at the second connection point and when a second voltage condition is present at the input terminal a fourth voltage condition is produced at the second connection point.

9. A digital signal conversion circuit in accordance with claim 8 including
inverting means having an input connection connected to said second connection point and having an output connection, said inverting means being operable to produce a fifth voltage condition at the output connection when a third voltage condition is present at the second connection point and to produce a sixth voltage condition at the output connection when a fourth voltage condition is present at the second connection point.

10. A digital signal conversion circuit in accordance with claim 9 wherein said inverting means includes
a sixth field effect transistor of the enhancement type connected between the output connection and the point of reference potential and having its gate connected to the second connection point;
a seventh field effect transistor of the depletion type connected between the source of operating potential and the output connection and having its gate connected to the output connection;

said sixth field effect transistor being biased to a low impedance condition in response to the presence of said third voltage condition at the second connection point thereby producing the fifth voltage condition at the output connection; and said sixth field effect transistor being biased to a high impedance condition in response to the presence of said fourth voltage condition at the second connection point thereby producing the sixth voltage condition at the output connection.

11. A digital signal conversion circuit in accordance with claim 10 wherein said first field effect transistor is operable in response to a voltage level at the input terminal less than a first predetermined voltage to produce a voltage at the first connection point biasing the fourth field effect transistor to a high impedance condition, and is operable in response to a voltage level at the input terminal greater than a second predetermined voltage to produce a voltage at the first connection point biasing the fourth field effect transistor to a low impedance condition; and said inverting means produces a voltage level at its output connection close to the voltage of the point of reference potential when the sixth field effect transistor is in a low impedance condition and produces a voltage level at its output connection close to the voltage of the source of operating potential when the sixth field effect transistor is in a high impedance condition.

12. A digital signal conversion circuit in accordance with claim 11 wherein said field effect transistors are N channel metal-oxide-silicon field effect transistors.

13. A digital signal conversion circuit in accordance with claim 12 wherein the input terminal is connected to a transistor-transistor-logic circuit which produces the input signals.

* * * * *